(12) United States Patent
Bunyan

(10) Patent No.: US 7,897,264 B2
(45) Date of Patent: Mar. 1, 2011

(54) REACTIVE FOIL ASSEMBLY

(75) Inventor: Michael H. Bunyan, Chelmsford, MA (US)

(73) Assignee: Parker-Hannifin Corporation, Cleveland, OH (US)

(*) Notice: Subject to any disclaimer, the term of this patent is extended or adjusted under 35 U.S.C. 154(b) by 913 days.

(21) Appl. No.: 11/726,825

(22) Filed: Mar. 23, 2007

(65) Prior Publication Data

US 2007/0224441 A1    Sep. 27, 2007

Related U.S. Application Data

(60) Provisional application No. 60/785,711, filed on Mar. 24, 2006.

(51) Int. Cl.
| | |
|---|---|
| B32B 3/00 | (2006.01) |
| B32B 3/02 | (2006.01) |
| B32B 3/24 | (2006.01) |
| B32B 15/04 | (2006.01) |
| B32B 15/08 | (2006.01) |
| B32B 15/20 | (2006.01) |

(52) U.S. Cl. ............. 428/626; 428/652; 428/680; 428/215; 428/336; 428/221; 428/304.4; 428/309.9; 428/458; 428/344; 428/131; 428/137

(58) Field of Classification Search ............... 428/615, 428/652, 621, 680, 215, 216, 336, 221, 304.4, 428/309.9, 457, 458, 344, 343, 624, 626, 428/596, 131, 132, 137, 138
See application file for complete search history.

(56) References Cited

U.S. PATENT DOCUMENTS

| | | | | |
|---|---|---|---|---|
| 4,435,481 | A * | 3/1984 | Baldi | 428/550 |
| 6,386,108 | B1 * | 5/2002 | Brooks et al. | 102/217 |
| 6,752,083 | B1 * | 6/2004 | Lerche et al. | 102/202.7 |
| 2003/0164289 | A1 * | 9/2003 | Weihs et al. | 204/192.12 |
| 2004/0251524 | A1 * | 12/2004 | Snyder et al. | 257/678 |
| 2005/0136270 | A1 * | 6/2005 | Besnoin et al. | 428/469 |
| 2006/0219759 | A1 * | 10/2006 | Duckham et al. | 228/234.3 |
| 2007/0257364 | A1 * | 11/2007 | Van Heerden et al. | 257/737 |

* cited by examiner

*Primary Examiner*—Michael La Villa
(74) *Attorney, Agent, or Firm*—Rissman Hendricks & Oliverio, LLP

(57) ABSTRACT

A reactive foil assembly for the packaging and presenting of a reactive foil. The reactive foil assembly comprising a reactive foil, a film, a flex circuit and an adhesive. The reactive foil is placed above the film such that a portion of the reactive foil does not overlap with the film. The flex circuit is also placed above the film such that the flex circuit is operably coupled to the reactive foil. The reactive foil assembly is placed over a surface such that the film adheres to the surface with the help of the adhesive. The reactive foil is ignited by an energy pulse provided by the power source and delivered by the flex circuit coupled to the power source. An exothermic reaction of the reactive foil is initiated, which provides a molten foil available for joining of two objects.

28 Claims, 8 Drawing Sheets

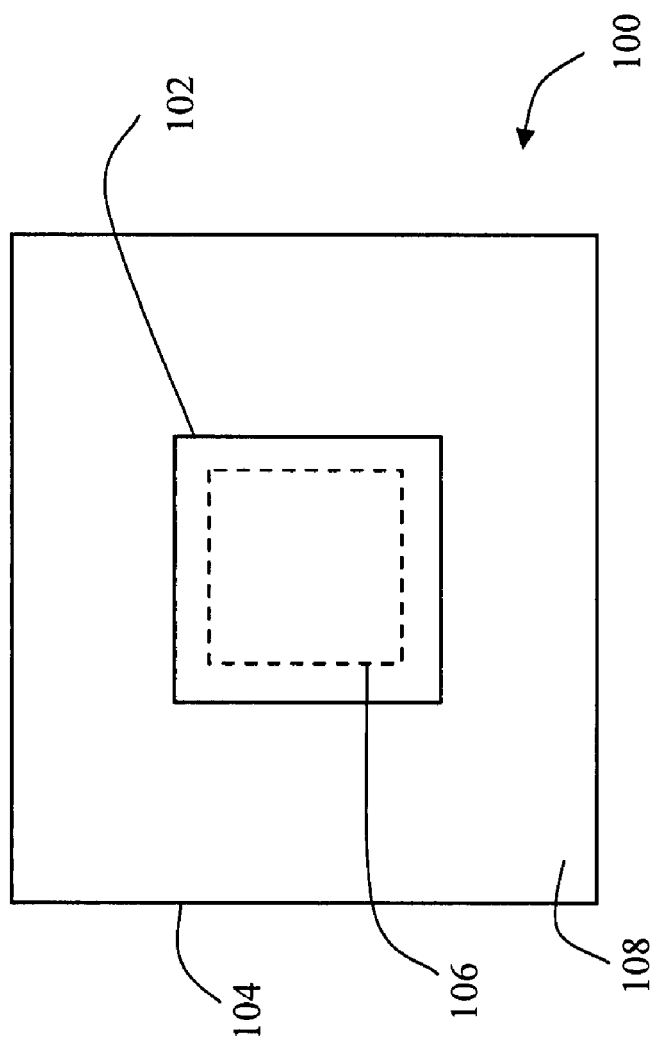
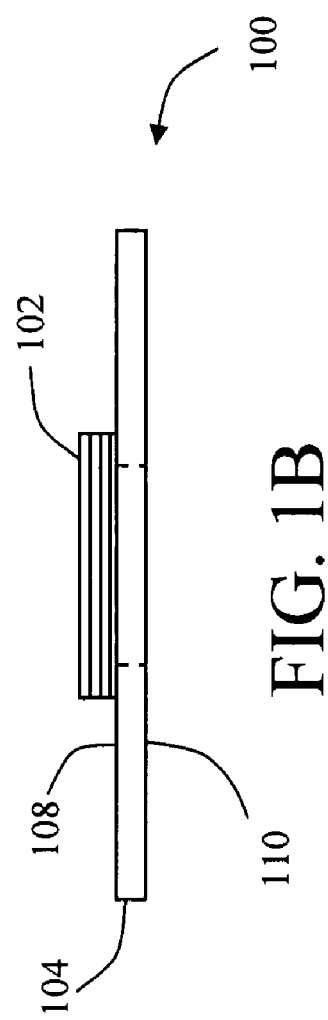
FIG. 1A
FIG. 1B

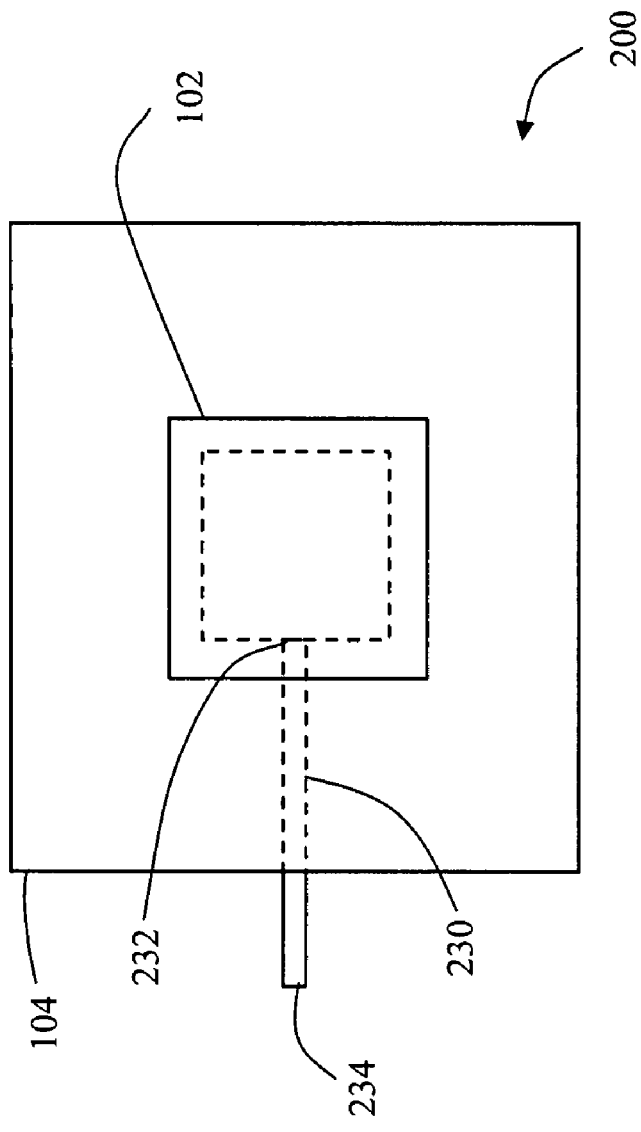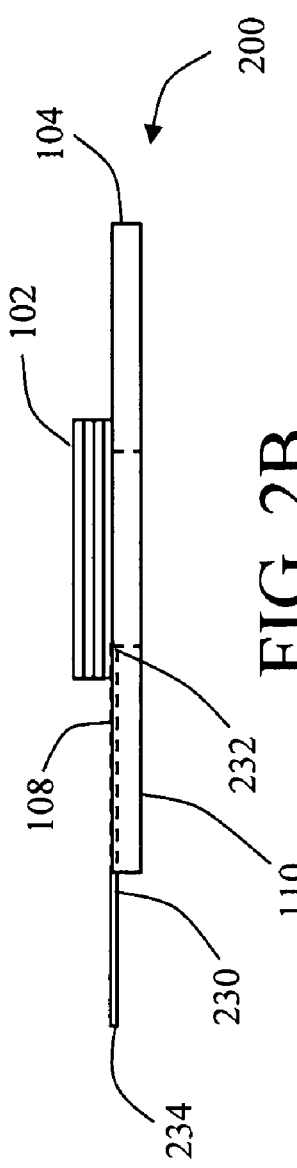

REACTIVE FOIL ASSEMBLY

CROSS-REFERENCE TO RELATED APPLICATIONS

This application claims the benefit of priority from U.S. Provisional Application No. 60/785,711 filed on Mar. 24, 2006, the specification of which is incorporated herein by reference.

BACKGROUND OF THE INVENTION

The present invention relates to reactive foils. More particularly, the present invention relates to a packaged reactive foil assembly.

Reactive foils are used for joining various materials for example, metals, semiconductors, ceramics, plastics, polymer composites and the like. Reactive foils are used very efficiently in joining similar types of materials or dissimilar types of materials. A non-exhaustive list of applications of reactive foil includes among others, the mounting of a heat sink on a chipset, the mounting of radio frequency (RF) connectors on printed circuit boards, attaching ceramic armors to tanks, the mounting of sputtering targets, hermetically sealing of photocells, capacitors, sensors, electronic devices, and the like.

Conventionally, for joining two materials, a reactive foil is placed between the two materials. The reactive foil is then ignited, initiating an exothermic reaction of multiple nanolayers present in the reactive foil. Very high amounts of energy per unit volume are produced by this reaction within fractions of a second, melting the reactive foil. The released energy may also melt a portion of the surface of the materials, creating a strong, true metallic joint. More specifically, reactive foils are multilayered structures and may be used in the creation of strong and permanent bonds between two or more surfaces. Such reactive foils comprise a stack of nanolayers (having thicknesses of the order of nanometers) of two or more elements or compounds, the layers being positioned in alternate configuration. The reactive foils are fabricated by depositing thousands of alternate nanolayers of at least two elements or compounds.

An example of a reactive foil is a multilayered structure comprising multiple nanolayers of aluminum and nickel. Thousands of nanolayers of aluminum and nickel are deposited alternately to form the reactive foil. When the reactive foil is ignited with an energy pulse, the nanolayers of aluminum and nickel start to undergo an exothermic reaction. The exothermic reaction of aluminum and nickel releases high amounts of heat energy per unit volume within fractions of a second. Further, once the reactive foil is ignited, the exothermic reaction is self-propagating and self-sustaining. The reactive foil delivers enough heat energy that is sufficient for melting the whole reactive foil within a fraction of a second. During the exothermic reaction, the temperature of the reactive region may reach a temperature of up to 1500° C. When the reaction is initiated, heat energy flows in a predictable and controllable manner. By varying the composition of the reactive foil, the thickness and number of nanolayers, the temperature, total energy released, and the velocity of energy flow during the exothermic can be controlled.

Controlled and localized heat generated from the reactive foil can be configured to deliver broad ranges of temperatures, heat energy, and energy flow in desired direction(s) and at desired location(s) in any environment. Overall, reactive foil is a promising technology for precise delivery of heat energy. However, this technology is plagued by various drawbacks as described below.

For example, while joining two materials, the reactive foil is placed between the surfaces of two materials. The reactive foil is placed nearly at the desired location of the joint creation between the surfaces. Pressure is applied to the surfaces to prevent any undesired movement of the reactive foil from the desired location of the joint creation. However, in these conventional methods, the reactive foil may get displaced from the original location, thereby creating a malformed or even a faulty joint. Therefore, there exists a need to provide a system and a method for the prevention of the undesirable displacement of the reactive foil.

Further, the exothermic reaction is initiated by providing an energy pulse using means such as the compression of the reactive foil between two surfaces, an electrical pulse, a spark, a hot filament, and a laser beam. However, none of these listed means is simple, reliable, easy to use, cheap, and user friendly. Therefore, there exists a need for a system and a method for providing a simple, reliable, easy to use, cheap, and user friendly means of igniting the reactive foil.

Furthermore, in some cases as the reactive foil melts, the molten material may splatter onto adjacent regions. Splattering of molten material to the adjacent regions leads to the damage of adjacent electronic components, such as capacitors, transistors, resistors, diodes, integrated circuits, and the like. Therefore, there exists a need to provide a system and a method for the protection of adjacent electronic components from the splattering of molten material.

Further, a reactive foil may be used for the joining of two surfaces, wherein the location of the joint is difficult to access and the joining area is very small. Since the area of the joint is small and inaccessible, the use of a smaller reactive foil poses a problem in terms of the precise handling placement of the reactive foil at the desired location of the joint creation. Therefore, there exists a need for a system and a method to facilitate the joining of small and inaccessible areas.

It is therefore desirable to provide a system and a method to address the issues of the undesired displacement of the reactive foil, ignition of the reactive foil, splattering of melt material from the reactive foil, and handling and placement of the reactive foil at a location that is very small and inaccessible.

SUMMARY OF THE INVENTION

In one aspect, the present invention provides a reactive foil assembly for joining two objects. The reactive foil assembly includes a reactive foil and a film, such that the reactive foil is positioned above the film.

In another aspect, a reactive foil ignition assembly for the ignition of the reactive foil comprises a reactive foil and one or more flex circuits. Each of the flex circuits may comprise one or more reactive ends, which are operably coupled to the reactive foil.

Further, in various aspects, the present invention provides a reactive foil ignition assembly for providing a system and a method for the ignition of a reactive foil which is simple, reliable, easy to use, cheap, user friendly and prevents the undesirable displacement of the reactive foil from the original location of joint creation.

Furthermore, in various aspects, the present invention provides for a reactive foil assembly that protects nearby electronic components from the splattering of molten material from the ignited reactive foils.

Still furthermore, in various aspects, the present invention provides a reactive foil assembly for the joining of two surfaces, which provides clean break features for reworkability.

Still furthermore, in various aspects, the present invention provides a reactive foil assembly for joining two surfaces with increased ease, wherein the desired location of joint creation is otherwise difficult to access, easy to manufacture and user friendly.

BRIEF DESCRIPTION OF THE DRAWINGS

The foregoing and other advantages and features of the invention will become apparent upon reading the following detailed description and upon reference to the drawings in which:

FIGS. 1A and 1B illustrate the top view and the side view of a reactive foil assembly according to various embodiments of the present invention;

FIGS. 2A and 2B illustrate the top view and the side view of a reactive foil assembly according to various other embodiments of the present invention;

DETAILED DESCRIPTION OF THE INVENTION

Figure 3:
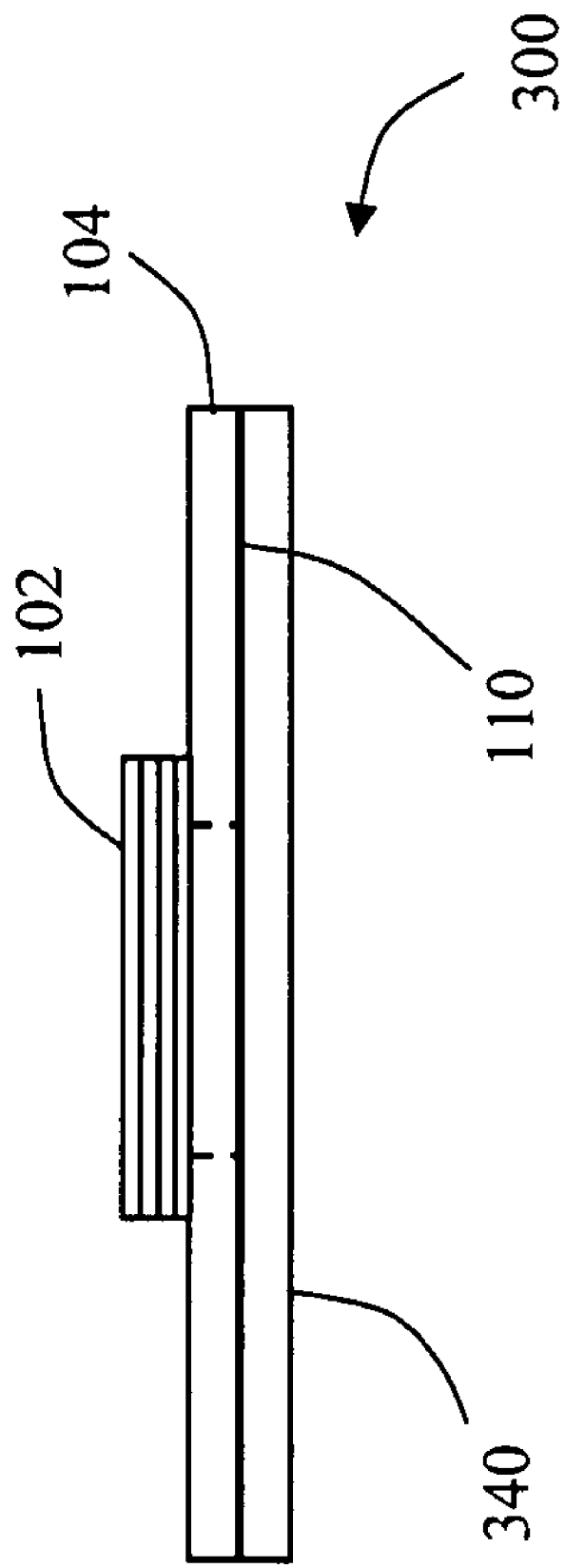
FIG. 3 illustrates a front side view of a reactive foil assembly according to various other embodiments of the present invention.

As used herein, "a" refers to at least one, unless otherwise mentioned. As used herein, the terms "above" and "below" are used merely to depict the configuration as shown in the figures, and unless otherwise mentioned, have been used interchangeably. Obvious variations (such as interchanging the "above" and "below" configurations) will be apparent to those skilled in the art and are included within the scope of the present invention as captured by the appended claims. As used herein, the terms "positioned above" and "positioned below" with respect to any two layers do not necessarily require the layers to be immediately adjacent to each other. That is, for example, if a first layer is positioned below a second layer, this may include configurations having other materials/layers being present between the first and the second layers. Therefore, various intermediary materials or layers may be present between the layers positioned above or below. Further, as used herein, the term "opening" in a surface is not limited to a hole or space in a surface that is surrounded by the surface completely, but it is also intended to include indentations or recesses along the boundary of such a surface. The opening may have shapes including circles, semi-circles, rectangles, triangles, polygons, parabolas, irregular shapes, or a combination among various others. As used herein, the term "attaching means" includes means of attaching two objects or surfaces, and includes various means such as mechanical, chemical, thermal, and the like, and for example, fasteners, adhesives, and solders among others. Some of these attaching means include releasable attaching means, that is for example, sticky adhesives that provide adherence between two surfaces, but are configured to be separable as and when required. The attaching means serve to provide an operational coupling between two objects or surfaces, according to the intended purpose. Further, those skilled in the art will readily appreciate that suitable attaching means may be used according to the intended purpose, and all such combinations are embodied in the present invention defined by the claims appended hereto.

FIGS. 1A and 1B illustrate a reactive foil assembly 100 in its top view and side view respectively, according to various embodiments of the present invention. The reactive foil assembly 100 comprises a reactive foil 102 and a film 104 positioned below the reactive foil 102. The film 104 is positioned such that at least a portion of the reactive foil 102 does not overlap with the film 104. For example, in the configuration illustrated in FIGS. 1A and 1B, the film 104 comprises an opening 106 (dotted line) over which the reactive foil 102 does not overlap with the film 106. In this configuration the reactive foil 102 completely covers the opening 106, while in other envisioned configurations the reactive foil 102 may only partially cover the opening 106.

As is appreciated in the art, the reactive foil 102 is a multilayered structure and comprises a stack of alternate nanolayers of two or more elements. It may be noted here that the multiple layers of the reactive foil 102, such as those illustrated in FIG. 1B and other figures, are merely for illustration and do not represent the scale of the thickness or the number of nanolayers, each of which has a thickness on the order of nanometers. The reactive foil 102 is fabricated by depositing thousands of alternate nanolayers of two or more elements, and accordingly, the reactive foil 102 may have a thickness of several microns.

In use for joining two objects (not shown), the assembly 100 may be positioned between target surfaces of the two objects. The reactive foil 102 may be ignited with an energy pulse, and on ignition, the nanolayers start to undergo an exothermic reaction. The exothermic reaction releases high amounts of energy per unit volume within a short duration of time. Once the reactive foil 102 is ignited, the exothermic reaction is self-propagating and self-sustaining. The reactive foil 102 delivers heat energy sufficient for melting the reactive foil 102 completely within a fraction of seconds. The reaction (and hence the energy generated) flows in a predictable and controllable manner. By varying the composition of the reactive foil, the thickness and number of the nanolayers, the temperature, the energy released, and the velocity of the energy flow can be controlled. The film 104 is a thermally stable and an electrically non-conductive film, and can be constructed from various materials such as, metals, non-metals, plastics, fibers, yarns, polymer composites, and the like.

According to certain other embodiments, the reactive foil 102 is attached to the film 104 at the first surface 108 using various attaching means, including mechanical means, chemical means, thermal joints or a combination thereof. The attaching means (not shown in the figures) include fasteners and adhesives among others. This attachment of the reactive foil 102 with the film 104 allows for preserving the positioning of the reactive foil 102 with respect to the opening 106. Further, the second surface 110 of the film 104 also comprises attaching means, similar to or different than the attaching means used for the first surface 108. The attaching means for the second surface 110 allows for attaching the film 104 over a surface to be joined. In this way, the film 104 is positioned over the surface to be joined in a substantially stable configuration, thereby advantageously allowing for positioning the reactive foil 102 substantially accurately over the relevant area of the surface to be joined. This packaging of the reactive foil assembly 100, therefore advantageously eliminates various disadvantages of the conventional reactive foil solutions, such as the movement of part-to-die, misalignment and the like, among others. Further, the present invention provides for the economical use of the reactive foil 102 by allowing only the required amount of reactive foil to be positioned above the film 104, thereby minimizing wastage of the reactive foil. This feature potentially allows for substantial cost savings.

In the embodiments illustrated by FIGS. 1A and 1B, for example, the reactive foil 102 is a multilayered structure comprising thousands of nanolayers of aluminum (Al) and nickel (Ni) deposited alternately to form the reactive foil 102. The thickness of each of the nanolayers of aluminum and nickel is about 174 nanometers, while the total thickness of the reactive foil 102 is about 175 microns.

The reactive foil 102 is attached to the foil 104 using an adhesive (not shown) and preferably a releasable adhesive. In the embodiment illustrated in FIGS. 1A and 1B, the film 104 is a Kapton® film, available from E.I. du Pont de Nemours and Company. Those skilled in the art will appreciate that the use of the Kapton® film is not meant to be restrictive, and alternatively, films having similar qualities may be used without deviating from the scope of the present invention summarized by the appended claims.

In certain aspects of the invention, the reactive foil 102 may comprise an additive material, in the form of layers or otherwise. In certain embodiments, the additive material is at least one indium solder layer (not shown). Each of the indium solder layers may be deposited on one or more sides of the reactive foil 102. The reactive foil 102 coated with indium layers may be used, for example, in the soldering of an electronic component to a motherboard. In general, the additive materials provide added functionality or capability to the nature of the joint formed using the reactive foil assembly as discussed.

The reactive foil assembly 100 may be formed into a roll and packaged for consumption. Alternatively, the reactive foil assembly 100 may be packaged as a stack of multiple reactive foil assemblies, similar to the foil assembly 100. Various packaging configurations will be apparent to those skilled in the art and such configurations are included within the scope of the present invention as captured in the claims appended hereto.

In certain embodiments, the reactive foil assembly 100 additionally includes a package protection film (not shown) positioned above the reactive foil 102. The package protection film is useful in presenting the reactive foil assembly 100 in a packaged form, as well as for generally protecting the reactive foil 102. The package protection film is configured to be releasably attached to the film 104, and is configured so as to protect the reactive foil 102 from inadvertent damage during packaging, transportation or other intermediary movement before final consumption. The reactive foil assembly 100 including the package protection film may be easily rolled, or stacked for being packaged. The package protection film may be similar to the film 104 or include other plastic films.

In various embodiments, the reactive foil assembly may be packaged in a pouch, which may be flexible, non-flexible or a combination thereof The pouch may comprise a silicone coating in the interior of the pouch. The pouch may be torn and the reactive foil assembly 100 packaged as above, for example, may be taken out from the pouch for consumption.

FIGS. 2A and 2B illustrate a reactive foil assembly 200 in its top view and side view, respectively, according to various other embodiments of the present invention. The reactive foil assembly 200 comprises the reactive foil 102, the film 104, and a flex circuit 230. The flex circuit 230 is attached to (or disposed above) the film 104 using appropriate attaching means. The flex circuit 230 comprises a reactive end 232 and a power source end 234. The reactive end 232 is operably coupled with the reactive foil 102 and supplies the energy pulse to ignite the reactive foil 102. The power source end 234 is operably coupled with a power source (not shown) that provides the energy pulse, and the power source end may extend beyond the film 104. The flex circuit 230 is attached to film 104 such that the reactive end 232 is operably coupled to the reactive foil 102. In certain embodiments, the flex circuit 230 may also be constructed inside film 104, that is, the flex circuit 230 may be disposed between the first surface 108 and the second surface 110. In certain other embodiments, the film 104 may have internally constructed circuits (not shown) that are configured to supply power from the power source to the reactive foil 102. As used herein, in the context of the flex circuit 230 and the film 104, the term "coupled" is intended to include all configurations, including but not limited to, the flex circuit 230 being attached to, disposed above or constructed into the film 104.

In operation, the reactive foil 102 is ignited when the power source end 234 is powered using the power source and an exothermic reaction of the foil 104 is initiated. The power source may be a source of an alternating current or a direct current, or may just provide an impulse of current sufficient to initiate the reaction. The power sources include, for example, electrochemical cells, electrical fuel cells, solar cells, dynamo, electrical power generators, and the like. In certain embodiments, the power source is a 9.0 V battery. Furthermore, in another embodiment, the reactive foil assembly 200 may have multiple reactive foils. In such embodiments, the reactive foil assembly 200 is configured to include either multiple flex circuits corresponding to the multiple reactive foils, or a single flex circuit 230 having multiple reactive ends corresponding to the multiple reactive foils. Specific drawings of such embodiments are not included separately in the figures, but will be apparent readily to those skilled in the art. Each of the multiple reactive foils may be positioned above the film 104 on the first surface 108, such that at least a portion of each of the multiple reactive foils does not overlap with the film. The reactive foil assembly 200 may be formed into a roll and packaged for consumption. Alternatively, the reactive foil assembly 200 may be packaged as a stack of multiple reactive foil assemblies, similar to the packaged foil assembly 200. Various packaging configurations will be apparent to those skilled in the art, and such configurations are included within the scope of the present invention as captured in the claims appended hereto.

FIG. 3 illustrates a reactive foil assembly 300 according to certain embodiments of the present invention. The reactive foil assembly 300 comprises the reactive foil 102, the film 104, and a base film 340. The base film 340 is positioned below the film 104 and attached to the second surface 110 using suitable attaching means. The base film 340 is a thermally stable and electrically non-conductive film, and the base film 340 may be constructed using various materials such as, metals, non-metals, plastics, fibers, yams, polymer composites, and the like.

In certain embodiments, the base film 340 is a Kapton film, and the attaching means used to attach the film 104 to the base film 340 is an adhesive. The adhesive (not shown in the figure) is disposed between the interface of the film 104, that is, on the second surface 110 and the base film 340. The adhesive is a releasable adhesive and is configured to allow for peeling off the base film 340 such that the adhesive is retained on the second surface 110.

Figure 4:
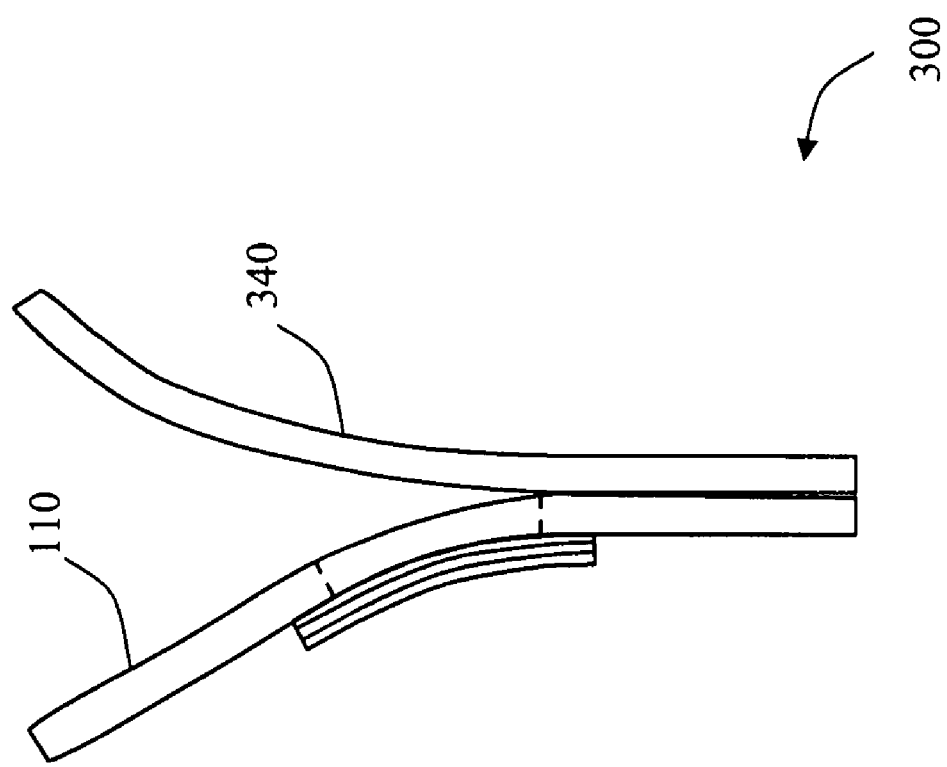
FIG. 4 illustrates a longitudinal side view of the reactive foil assembly of FIG. 3.

FIG. 4 illustrates the reactive foil assembly 300 in accordance with certain aspects of the invention. The base film 340 is half peeled off from the film 104, leaving behind the releasable adhesive (not shown) on second surface 110. The film 104 may be completely peeled off from the base film 340, and the film 104 along with the reactive foil assembly may be placed onto one of the two objects to be joined, such that the second surface 110 is attached to the target surface of one of the objects to be joined. The reactive foil assembly 300 may be formed into a roll and packaged for consumption. Alternatively, the reactive foil assembly 300 may be packaged as a stack of multiple reactive foil assemblies, similar to the packaged foil assembly 300.

Figure 5:
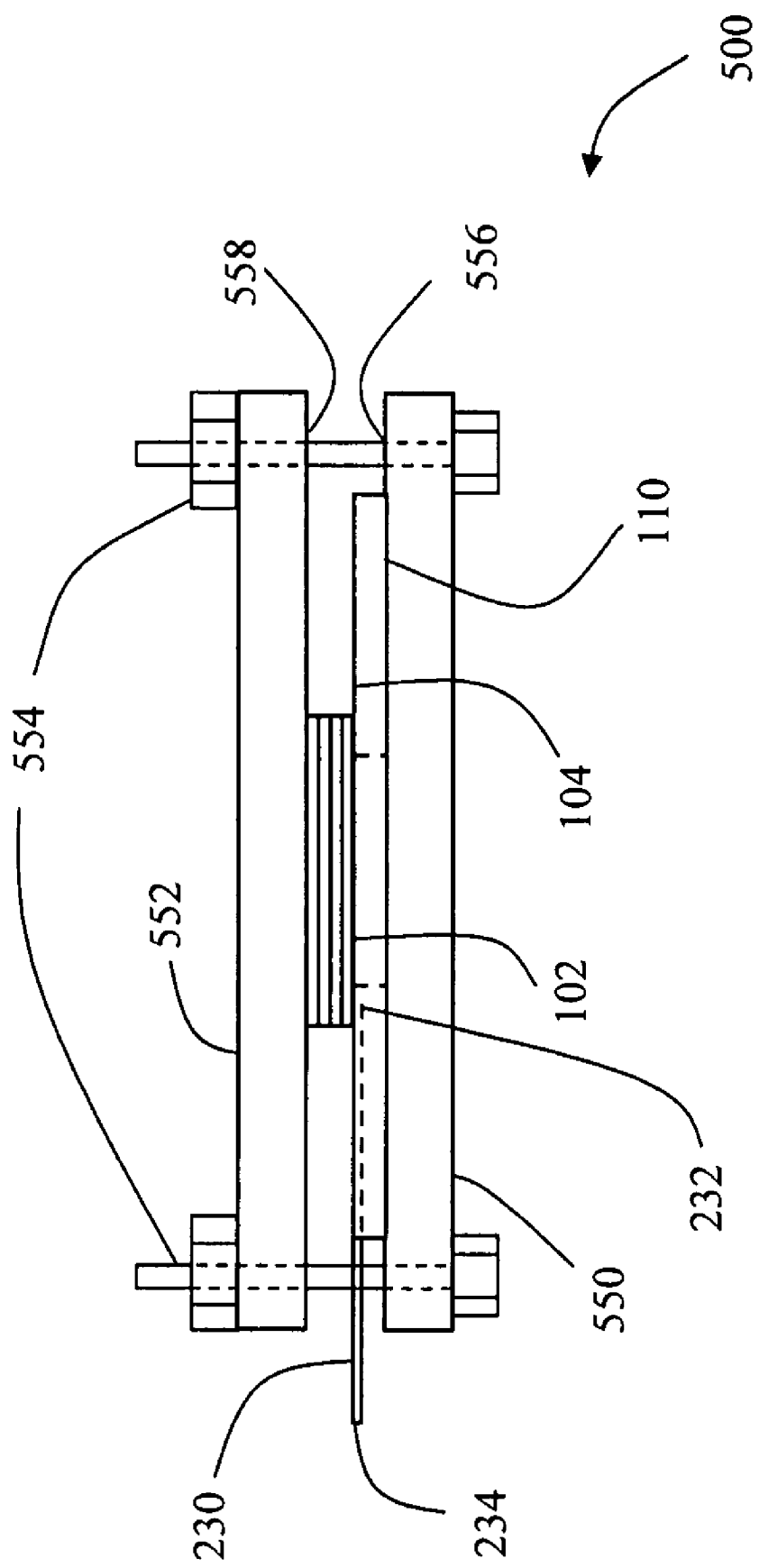
FIG. 5 illustrates an assembly comprising a reactive foil assembly according to various embodiments of the present invention.

FIG. 5 illustrates an assembly 500 comprising the reactive foil assembly 200 (of FIG. 2), a first object 550, a second object 552, and a fastening system 554 according to various embodiments of the present invention. The reactive foil assembly 200 is used to join the first object 550 to the second object 552. The first object 550 comprises a first object surface 556 and the second object 552 comprises a second object surface 558. The reactive foil assembly 200 is placed above the first object 550 such that the second surface 110 of the film 104 is positioned above the first object surface 556. An attaching means, such as an adhesive, may be applied to the second surface 110, such that the second surface 110 adheres to the first object surface 556. In this way, the reactive foil assembly 200 is positioned above the first object 550 such that the reactive foil 102 is positioned at the target surface of the first object. The second object 552 is then configured to attach to the first object 550. The second object 552 is positioned above the reactive foil assembly 200. Consequently, the reactive foil assembly 200 is sandwiched between the first object 550 and the second object 552. Attaching means, such as the fastening system 554, for example, as illustrated in the figure, is used to hold the first object 550 and the second object 552 together. The fastening system 554 is tightened to avoid any undesirable relative movement between the first object 550 and the second object 552. The power source end 234 of the flex circuit 230 reaches out to the reactive foil assembly 200. The battery source end 234 may be operably coupled to a power source (not shown in the figure). On ignition of the reactive foil, an exothermic reaction is initiated. At least a portion of the reactive foil 102 melts in very short duration of time, and preferably in fractions of a second. At least a portion of the first object 550 or the second object surface 552 melts down and together with the molten reactive foil (not shown) to enable a metallic joint between the first object 550 and the second object 552 at the first object surface 556 and the second object surface 558. The metallic joint is created within a few seconds of ignition of the reactive foil. After the metallic joint has been created, the residual reaction foil assembly 200, that is, the film 104 and the flex circuit 230 may be removed from the first object 550 by unfastening the fastening system 554. For example, the film 104 and the flex circuit 230 may be pulled away, or cut away appropriately using precise tools such as microcontroller controlled cutting devices, or other such appropriate methods of removal that will occur readily to those skilled in the art, and are included within the scope of the present claims.

Figure 6:
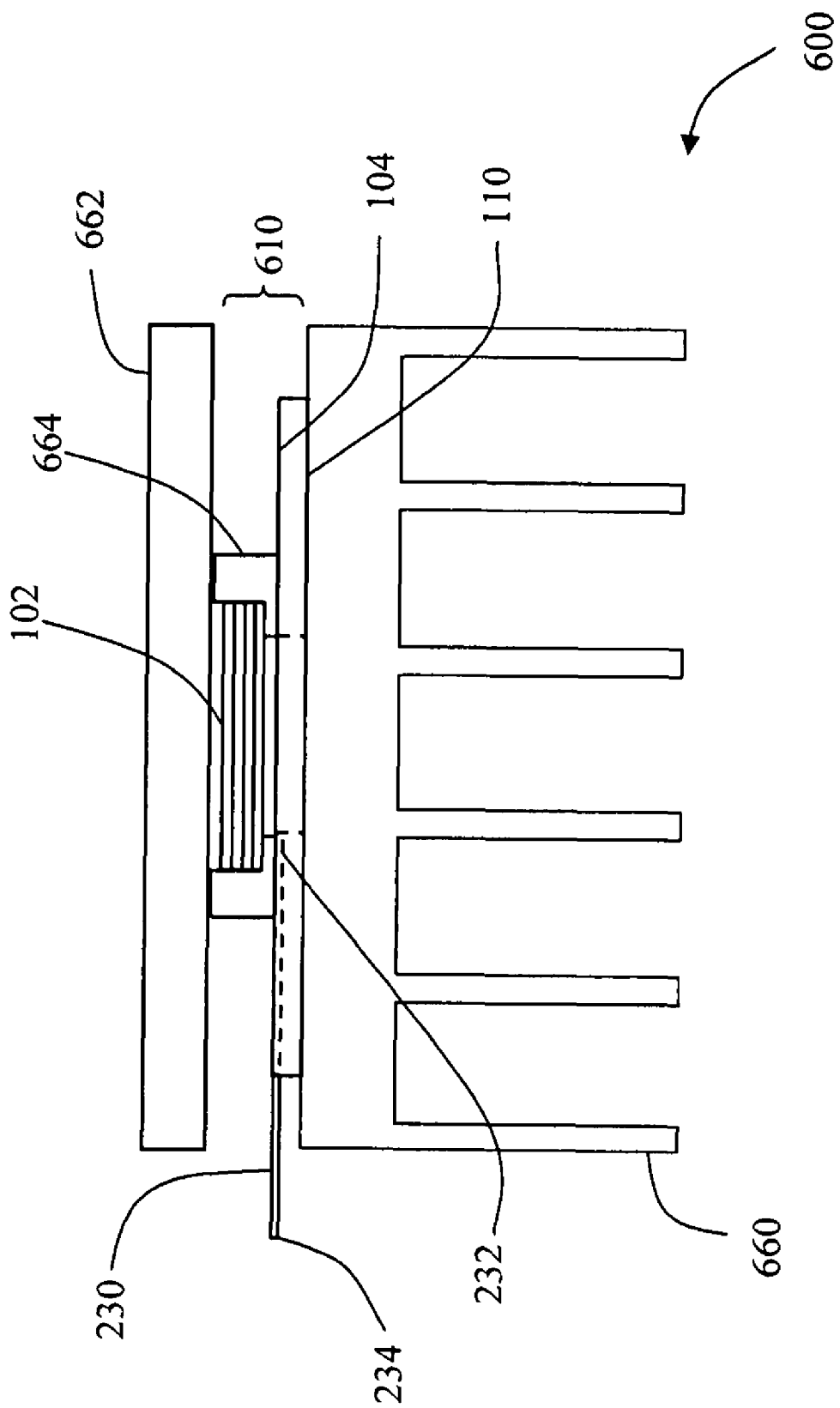
FIG. 6 illustrates an assembly comprising a reactive foil assembly according to various other embodiments of the present invention.

FIG. 6 illustrates assembly 600 according to certain aspects of the present invention. The assembly 600 comprises a reactive foil assembly 610, a heat sink 660, and a chipset 662. The reactive foil assembly 610 comprises a reactive foil 102, a film 104, a flex circuit 230, and a foam frame 664. The foam frame 664 is placed above the film 104 such that at least a portion of the reactive foil 102 is surrounded by at least a portion of the foam frame 664. Moreover, the reactive foil 102 is surrounded by the foam frame 664. Foam frame 664 is attached to film 104 using various means such as, mechanical means, chemical means, thermal means, adhesives and the like. Further, the heat sink 660 is attached to the chipset 662 such that the reactive foil assembly 610 is positioned at a desired location of joint creation.

The foam frame 664 forms a dam structure. The dam structure is configured to block the splattering of molten material caused by the reaction of reactive foil 102. Thus, the foam frame 664 protects the exterior or extended region of the chipset 662 or other nearby electronic components such as exposed capacitors and the like, from any damage caused by the splattering of molten material. The reactive foil assembly 610 may be formed into a roll and packaged for consumption. Alternatively, the reactive foil assembly 610 may be packaged as a stack of multiple reactive foil assemblies, similar to the packaged foil assembly 610. Various packaging configurations will be apparent to those skilled in the art, and such configurations are included within the scope of the present invention as captured in the claims appended hereto.

Figure 7:
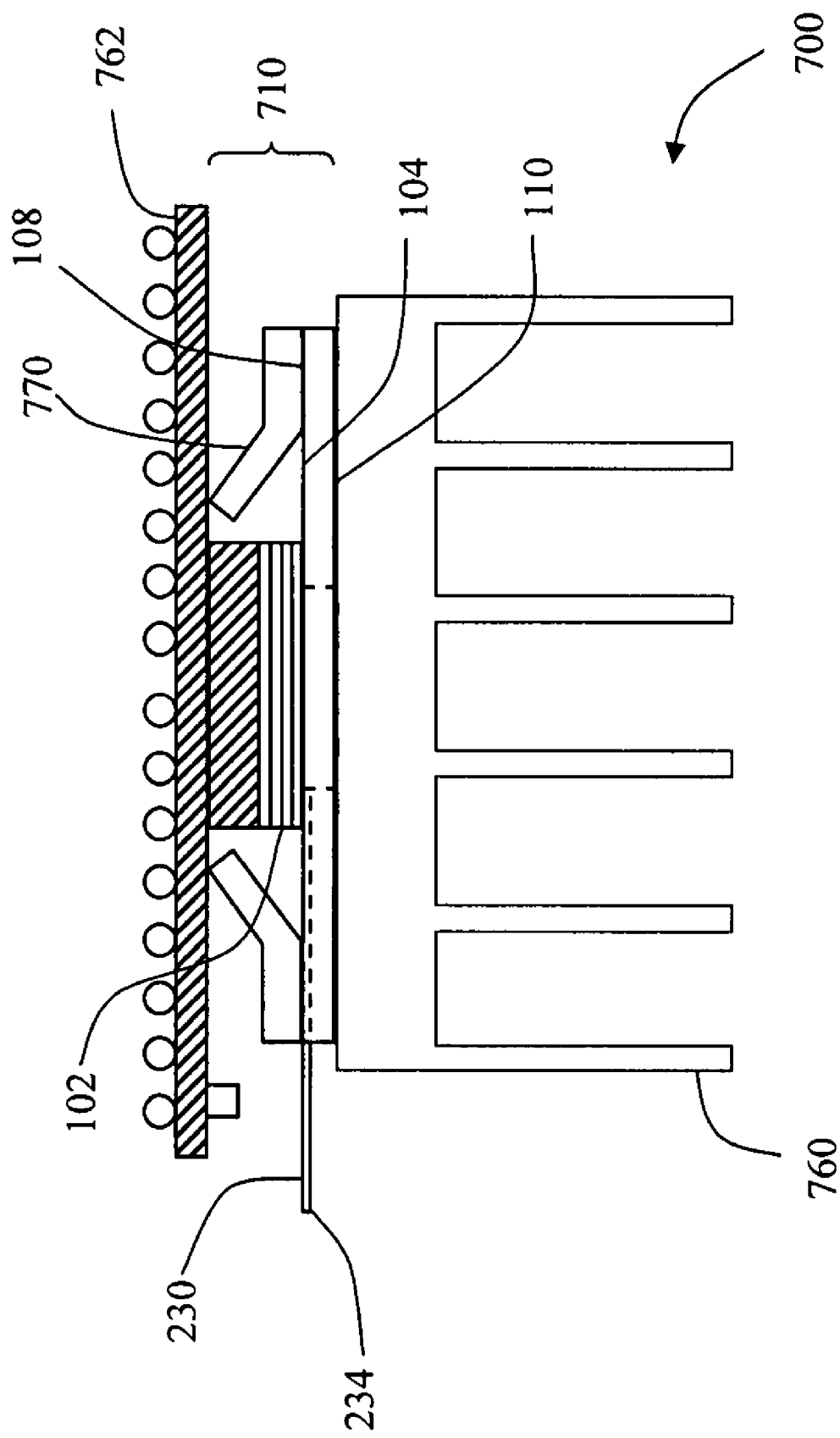
FIG. 7 illustrates an assembly comprising a reactive foil assembly according to various other embodiments of the present invention.

FIG. 7 illustrates an assembly 700 according to various embodiments of the present invention. The assembly 700 comprises a reactive foil assembly 710, a heat sink 660, and a chipset 762. The reactive foil assembly 710 comprises a reactive foil 102, a film 104, a flex circuit 230, and a protection film 770. The protection film 770 is positioned above the film 104 on the first surface 108, such that at least a portion of film 104 overlaps with the protection film 770 and the reactive foil 102 does not overlap with the protection film 770. Moreover, the protection film 770 positioned above the film 104 such that the reactive foil 102 is surrounded by the protection film 770. The protection film 770 is attached to the film 104 using various attaching means, such as, mechanical means, chemical means, thermal means, an adhesive and the like. A portion of the protection film 770 near the reactive foil 102 is in a bent configuration, i.e. is lifted up as shown in FIG. 7 to form a dam structure. The dam structure is configured to block splattering of molten material caused by reaction of the reactive foil 102. Further, the heat sink 660 is attached to chipset 762 such that reactive foil assembly 710 is positioned at a desired location of joint creation. Thus, the protection film 770 protects the exterior or extended region of the chipset 762 or nearby electronic components. The chipset 762 may be a resistor, an integrated circuit, a processor, microprocessors, and any electronic device that may need a heat sink. The chipset 762 may also comprise pin grid arrays (PGA) or ball grid arrays (BGA). Any of the PGA or BGA is fixed to the chipset 762 to facilitate joining of the chipset 762 to a motherboard. The reactive foil assembly 710 may be formed into a roll and packaged for consumption. Alternatively, the reactive foil assembly 710 may be packaged as a stack of multiple reactive foil assemblies, similar to the packaged foil assembly 710. Various packaging configurations will be apparent to those skilled in the art and such configurations are included within the scope of the present invention as captured in the claims appended hereto.

Figure 8A:
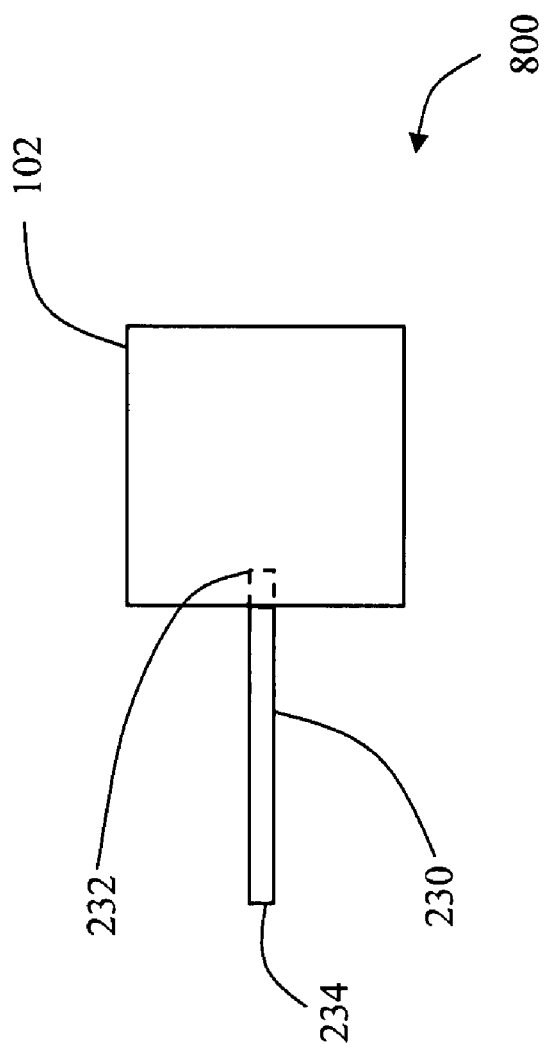
FIGS. 8A and 8B illustrate the top view and the side view of a reactive foil ignition assembly according to various embodiments of the present invention.
Figure 8B:
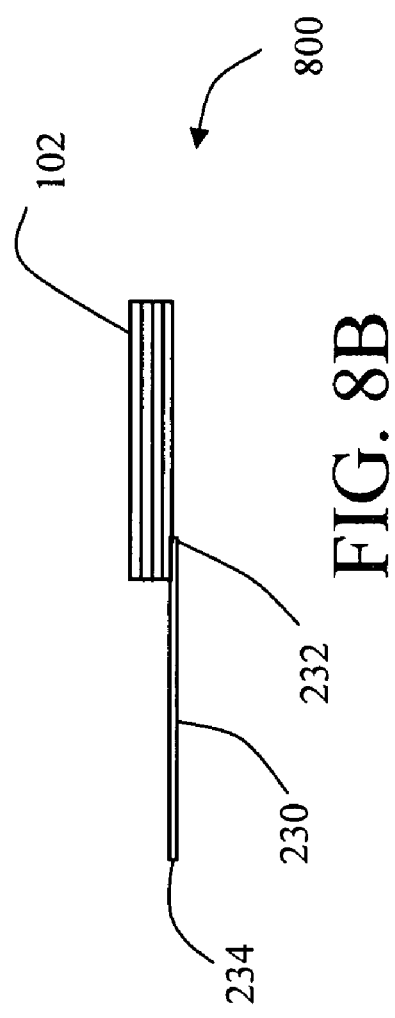

FIGS. 8A and 8B illustrate a top view and a side view, respectively, of a reactive foil ignition assembly 800 according to various embodiments of the present invention. The reactive foil ignition assembly 800 comprises a reactive foil 102 and a flex circuit 230. The flex circuit 230 comprises a reactive end 232 and a power source end 234. The flex circuit 230 is attached to the reactive foil 102 such that the reactive end 232 is operably coupled to the reactive foil 102. The flex circuit 230 is operably coupled to the reactive foil 102. The power source end 234 is coupled to a power source (not shown). The flex circuit 230 is of sufficient length and provides an ease in connecting the power source end 234 to the power source.

In operation, the power source supplies an energy pulse, which is supplied to the reactive foil 102 by the reactive end 232. This energy pulse ignites the reactive foil 102 and initiates an exothermic reaction of the reactive foil 102. In other embodiments, the reactive ignition assembly 800 comprises the flex circuit 230 having multiple reactive ends, similar to the reactive end 232. Each of the multiple reactive ends (not shown) are operably coupled with the reactive foil 102, and configured for providing a desired melting pattern of the reactive foil 102.

The present invention, as disclosed by various embodiments above, provides several advantages over the known state of the art. The reactive foil assembly may advantageously be used for the joining of two surfaces, wherein the area of joint creation is very small and usually difficult to access, by providing a cut-to-shape film. Further, the reactive foil assembly may be used to position the reactive foil onto the relevant area (target area at which the materials are to be joined) in an efficient manner, using economical quantities of the reactive foil. Owing to the larger size of the film compared to the reactive foil, the handling and placement of the reactive foil at target locations is markedly convenient, at the otherwise smaller and difficult to access areas. Further, the reactive foil assembly as discussed with reference to the various embodiments may be packaged and presented to the end customer as a convenient peel and stick part. Further, the reactive foil assembly may be configured for "pick and place" manufacturing. This advantageously provides for convenient transportation, handling and placement of the reactive foil up to its consumption, which otherwise requires extremely delicate handling.

Various examples of joining a first object to a second object include, joining of objects of similar material, joining of objects of dissimilar materials, mounting of a heat sink on a chipset, mounting radiofrequency connectors on printed circuit boards, attaching ceramic armors to tanks, mounting of sputtering targets, hermetically sealing of photocells, capacitors, sensors, electronic devices, repairing leaks, among various others. Moreover, the molten reactive foil may be used as a thermal interface material between a heat sink and a chipset. Furthermore, the reactive foil assembly also has applications in energetics such as in military pyrotechnics, fuses, structural energetics, propellant ignition and the like. According to various embodiments of the present invention, the present invention also discloses a method of providing a reactive foil assembly as discussed above. Moreover, the present invention may also be used as a method of joining a first surface to a second surface as discussed above. Further, the present invention may also be used a method of providing a reactive foil ignition assembly as discussed above.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is intended to cover all modifications, equivalents, and alternatives falling within the spirit and scope of the invention as defined by the following appended claims.

What is claimed is:

1. A reactive foil assembly for joining two objects comprising:
    at least one reactive foil;
    a film positioned below and in contact with the reactive foil, said film containing an opening therein, wherein said reactive foil covers at least a portion of said opening and wherein said film is a polyimide film; and
    a dam structure surrounding at least a portion of the reactive film and configured to block the splattering of molten metal material caused by the reactive foil.

2. The reactive foil assembly of claim 1, wherein the at least one reactive foil comprises nanolayers of at least two materials stacked alternately.

3. The reactive foil assembly of claim 2, wherein the at least two materials are aluminum and nickel.

4. The reactive foil assembly of claim 1, wherein the at least one reactive foil comprises at least one additive material.

5. The reactive foil assembly of claim 4, wherein the at least one additive material is coated on at least one surface of the at least one reactive foil.

6. The reactive foil assembly of claim 5, wherein the at least one additive material is an indium solder thin film.

7. The reactive foil assembly of claim 1, wherein the film comprises at least one circuit constructed into the film, the at least one circuit comprising at least one reactive end configured to be operably coupled to the at least one reactive foil.

8. The reactive foil assembly of claim 1 further comprising at least one flex circuit, the at least one flex circuit being coupled to the film, the at least one flex circuit comprising at least one reactive end configured to be coupled to the at least one reactive foil.

9. The reactive foil assembly of claim 1, wherein the shape of the opening is selected from the group consisting of circles, squares, rectangles, triangles, polygons, irregular shapes or a combination thereof.

10. The reactive foil assembly of claim 1 further comprising an attaching means disposed on in contact with the film such that at least a portion of the film is attachable using the attaching means.

11. The reactive foil assembly of claim 10, wherein the attaching means is an adhesive.

12. The reactive foil assembly of claim 11, wherein the adhesive is a releasable adhesive.

13. A reactive foil assembly for joining two objects comprising:
    at least one reactive foil;
    a film positioned below and in contact with the reactive foil, said film containing an opening therein, wherein said reactive foil covers at least a portion of said opening and wherein said film is constructed from materials selected from the group consisting of plastics and polymer composites; and
    a dam structure surrounding at least a portion of the reactive film and configured to block the splattering of molten metal material caused by the reactive foil;
    wherein the reactive foil assembly is presented as a package, wherein the package includes a package protection film.

14. The reactive foil assembly of claim 13, wherein the package comprises the reactive foil assembly in a roll configuration.

15. The reactive foil assembly of claim 13, wherein the package comprises the reactive foil assembly in a stack configuration.

16. A reactive foil assembly for joining two objects comprising:
- at least one reactive foil;
- a film positioned below and in contact with the reactive foil, said film containing an opening therein, wherein said reactive foil covers at least a portion of said opening and wherein said film is constructed from materials selected from the group consisting of plastics and polymer composites; and
- a dam structure surrounding at least a portion of the reactive film and configured to block the splattering of molten metal material caused by the reactive foil;
- wherein the dam structure comprises at least one foam frame.

17. A reactive foil assembly for joining two objects comprising:
- at least one reactive foil;
- a film positioned below and in contact with the reactive foil, said film containing an opening therein, wherein said reactive foil covers at least a portion of said opening and wherein said film is constructed from materials selected from the group consisting of plastics and polymer composites; and
- a dam structure surrounding at least a portion of the reactive film and configured to block the splattering of molten metal material caused by the reactive foil;
- wherein a base polyimide film is positioned below the film, and wherein the at least one reactive foil overlaps with the base film, and wherein the film overlaps with the base film.

18. A reactive foil assembly for joining two objects comprising:
- at least one reactive foil;
- a film positioned below and in contact with the reactive foil, said film containing an opening therein, wherein said reactive foil covers at least a portion of said opening and wherein said film is constructed from materials selected from the group consisting of plastics and polymer composites; and
- a dam structure surrounding at least a portion of the reactive film and configured to block the splattering of molten metal material caused by the reactive foil;
- wherein a protection film is positioned above the film, and wherein at least a portion of the film overlaps with the protection film, and wherein at least a portion of the at least one reactive foil does not overlap with the protection film, said protection film being selected from the group consisting of plastics and polymer composites.

19. The reactive foil assembly of claim 18 further comprising an attaching means being disposed on the interface of the protection film and the film.

20. The reactive foil assembly of claim 19, wherein the attaching means is an adhesive.

21. The reactive foil assembly of claim 18, wherein the protection film is a polyimide film.

22. The reactive foil assembly of claim 18, wherein the dam structure comprises at least a portion of the protection film.

23. A reactive foil assembly for joining two objects comprising:
- at least one reactive foil;
- a film positioned below and in contact with the reactive foil, said film containing an opening therein, wherein said reactive foil covers at least a portion of said opening and wherein said film is a polyimide film;
- a surface of a first object to be joined in contact with the at least one reactive foil, and
- a surface of a second object to be joined in contact with the film and positioned below the film opening.

24. The reactive foil assembly of claim 23, wherein the at least one reactive foil comprises nanolayers of at least two materials stacked alternately.

25. The reactive foil assembly of claim 24, wherein the at least two materials are aluminum and nickel.

26. The reactive foil assembly of claim 23, wherein both objects are components of an electronic circuit.

27. The reactive foil assembly of claim 26, wherein one object is a heat sink.

28. The reactive foil assembly of claim 26, wherein one object is a chipset.

* * * * *